(12) United States Patent
Christo et al.

(10) Patent No.: US 9,456,498 B2
(45) Date of Patent: Sep. 27, 2016

(54) ELECTRONIC MODULE POWER SUPPLY

(71) Applicant: International Business Machines Corporation, Armonk, NY (US)

(72) Inventors: Michael A. Christo, Round Rock, TX (US); Julio A. Maldonado, Austin, TX (US); Roger D. Weekly, Austin, TX (US); Tingdong Zhou, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 257 days.

(21) Appl. No.: 14/040,659

(22) Filed: Sep. 28, 2013

(65) Prior Publication Data

US 2014/0029221 A1    Jan. 30, 2014

Related U.S. Application Data

(62) Division of application No. 12/895,623, filed on Sep. 30, 2010, now Pat. No. 8,572,840.

(51) Int. Cl.
| | |
|---|---|
| H05K 1/00 | (2006.01) |
| H05K 3/00 | (2006.01) |
| H05K 1/11 | (2006.01) |
| H05K 1/02 | (2006.01) |
| H05K 3/34 | (2006.01) |

(52) U.S. Cl.
CPC ............. H05K 1/112 (2013.01); H05K 1/0263 (2013.01); *H05K 3/3436* (2013.01); *H05K 2201/0355* (2013.01); *H05K 2201/1028* (2013.01); *Y10T 29/49128* (2015.01); *Y10T 29/49155* (2015.01)

(58) Field of Classification Search
CPC ........ H05K 1/11; H05K 1/111; H05K 1/112; H05K 1/113; H01L 2225/06548; H01L 21/486; H01L 23/481; H01L 23/49827; H01L 2224/13009
See application file for complete search history.

(56) References Cited

U.S. PATENT DOCUMENTS

| | | |
|---|---|---|
| 4,694,123 A | 9/1987 | Massey |
| 5,343,074 A | 8/1994 | Higgins, III et al. |
| 5,428,499 A | 6/1995 | Szerlip et al. |
| 5,574,630 A | 11/1996 | Kresge et al. |
| 5,953,214 A * | 9/1999 | Dranchak et al. ............ 361/767 |
| 6,075,211 A | 6/2000 | Tohya et al. |

(Continued)

OTHER PUBLICATIONS

IPCOM000015061D: "High performance PWB Structure"; IBM TDB; Jun. 13, 2002 (2 pages).

*Primary Examiner* — Hoa C Nguyen
*Assistant Examiner* — Xanthia C Cunningham
(74) *Attorney, Agent, or Firm* — James L. Baudino

(57) ABSTRACT

Power may be supplied to an electronic module according to various techniques. In one general implementation, for example, a system for supplying power to an electronic module may include a printed circuit board, the electronic module, and a conductive foil. The board may include a number of contact locations on a first side, with at least one of the contact locations electrically coupled to a via to a second side of the board. The electronic module may be electrically coupled to the contact locations on the first side of the board and receive electrical power through the at least one contact location electrically coupled to a via. The foil may be adapted to convey electrical power for the electronic module and electrically coupled on the second side of circuit board to at least the via electrically coupled to a contact location that receives electrical power for the electronic module.

14 Claims, 5 Drawing Sheets

(56) References Cited

U.S. PATENT DOCUMENTS

| | | | |
|---|---|---|---|
| 6,127,025 A | 10/2000 | Bhatt et al. | |
| 6,359,783 B1 | 3/2002 | Noble | |
| 6,369,331 B1* | 4/2002 | Kusano et al. | 174/260 |
| 6,495,394 B1* | 12/2002 | Nakata et al. | 438/107 |
| 6,711,811 B2 | 3/2004 | Hensley et al. | |
| 6,741,480 B2* | 5/2004 | Hartke et al. | 361/803 |
| 6,760,232 B2* | 7/2004 | Smith et al. | 361/780 |
| 6,847,527 B2 | 1/2005 | Sylvester et al. | |
| 6,847,529 B2* | 1/2005 | Dibene et al. | 361/803 |
| 6,853,559 B2* | 2/2005 | Panella et al. | 361/764 |
| 6,972,484 B2 | 12/2005 | Efland | |
| 6,979,784 B1* | 12/2005 | Duley | 174/260 |
| 7,209,366 B2* | 4/2007 | Prokofiev et al. | 361/803 |
| 7,241,641 B2* | 7/2007 | Savastiouk et al. | 438/106 |
| 7,257,004 B2* | 8/2007 | Costello | 361/719 |
| 7,298,623 B1* | 11/2007 | Kuczynski et al. | 361/719 |
| 7,298,628 B2 | 11/2007 | Panella et al. | |
| 7,353,590 B2 | 4/2008 | Fallon et al. | |
| 7,523,551 B2* | 4/2009 | Horng et al. | 29/854 |
| 8,018,738 B2* | 9/2011 | Doblar et al. | 361/803 |
| 2002/0164895 A1* | 11/2002 | Hartke et al. | 439/67 |
| 2003/0053302 A1* | 3/2003 | Kelly et al. | 361/780 |
| 2003/0198033 A1* | 10/2003 | Panella et al. | 361/760 |
| 2003/0214800 A1* | 11/2003 | Dibene et al. | 361/803 |
| 2004/0080052 A1* | 4/2004 | Ou et al. | 257/774 |
| 2005/0118448 A1* | 6/2005 | Brenneman et al. | 428/607 |
| 2005/0207131 A1* | 9/2005 | Prokofiev et al. | 361/760 |
| 2005/0248024 A1* | 11/2005 | Costello | 257/691 |
| 2007/0279880 A1* | 12/2007 | Weir et al. | 361/794 |
| 2008/0259581 A1 | 10/2008 | Lauffer et al. | |
| 2008/0315398 A1* | 12/2008 | Lo et al. | 257/693 |
| 2009/0042382 A1* | 2/2009 | Hawkey | H05K 3/3478 438/613 |
| 2009/0194888 A1* | 8/2009 | Jobetto | 257/784 |
| 2010/0304580 A1* | 12/2010 | Baycura | H05K 1/0286 439/65 |
| 2011/0085314 A1* | 4/2011 | Franz | 361/803 |

\* cited by examiner

ELECTRONIC MODULE POWER SUPPLY

BACKGROUND

The present invention relates to electronic modules, and more specifically to supplying electrical power to electronic modules.

Printed circuit boards provide a structure on which to integrate various electronic components. The integration may be both structural and electrical. That is, a printed circuit board may provide a common base by which to physically couple electronic components and provide a manner in which to electrically couple two or more of them. Physical coupling may, for example, take place through coupling electronic components to the printed circuit board by pin sockets and/or soldering. Electrical coupling between electronic components coupled to a printed circuit board may, for example, take place through conductive traces on or in the printed circuit board.

A printed circuit board may also include planes for providing common electrical coupling between components. The commons planes may, for example, be used for power, ground, and signaling. For a printed circuit board having electronic components that operate in different power domains, a number of planes may be included. Other solutions may involve the use of bus bars to provide power for an electronic component.

BRIEF SUMMARY

In one general implementation, a system for supplying electrical power to an electronic module may include a printed circuit board, an electronic module, and a conductive foil. The printed circuit board may include a number of contact locations on a first side, with at least one of the contact locations electrically coupled to a via to a second side of the printed circuit board. The electronic module may be electrically coupled to the contact locations on the first side of the printed circuit board and receive electrical power through the at least one contact location electrically coupled to a via to a second side of the printed circuit board. The conductive foil may be adapted to convey electrical power for the electronic module and electrically coupled on the second side of the circuit board to at least the via that is electrically coupled to a contact location that receives electrical power for the electronic module.

In another general implementation, a system for supplying electrical power to an electronic module may include a conductive foil. The conductive foil may have a first side and a second side and be adapted to convey electrical power for an electronic module. The conductive foil may include electrical coupling locations on the first side that correspond to a first set of printed circuit board vias and passageways from the first side to the second side that correspond to a second set of printed circuit boards vias.

The details and features of various implementations will be conveyed by the following description, along with the drawings.

DETAILED DESCRIPTION

Electrical power may be supplied to a printed-circuit-board-mounted electronic module through a variety of techniques. In certain implementations, a conductive foil may convey electrical power on the side of a printed circuit board that is opposite the side on which an electronic module is mounted. Thus, electrical power may be delivered to an electronic module without having to add additional power planes to the printed circuit board, which can assist in reducing its thickness and manufacturing complexity. Moreover, the conductive foil may be added after the printed circuit board is manufactured, which may be useful when post-manufacturing design changes are required.

Figure 1:
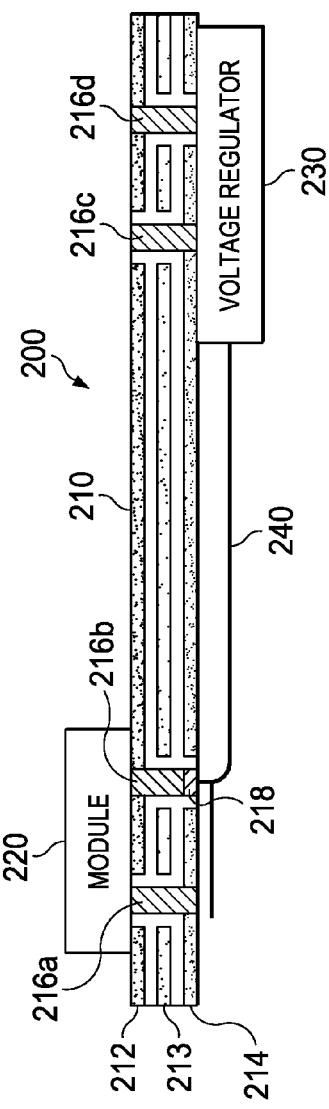
FIG. 1 is a drawing illustrating an example system for supplying power to an electronic module.

FIG. 1 illustrates an example system 100 for supplying power to an electronic module. In general, system 100 includes a printed circuit board 110, an electronic module 120, a voltage regulator 130, and a conductive foil 140.

Printed circuit board 110 may be any appropriate structure for structurally mounting and electrically coupling electronic components, such as resistors, capacitors, inductors, processors, and transceivers. Printed circuit board 110 has two sides 112*a*, 112*b* with dimensions that are typically relatively large compared to the board's thickness and may be composed of any appropriate material (e.g., fiberglass or FR-4). Printed circuit board 110 typically contains a variety of electrical conduits (e.g., traces, power planes, and ground planes) for electrically coupling electronic components mounted thereto.

Electronic module 120 may be any type of powered electronic device. For example, electronic module 120 may be a processor (e.g., a microprocessor, a microcontroller, or an application specific integrated circuit) or a transceiver. Electronic module 120 may be electrically coupled to printed circuit board 110 by any appropriate technique. For example, the electronic module may be coupled to a landing grid array (LGA) or ball grid array (BGA) on the printed circuit board. In the illustrated implementation, electronic module 120 is coupled to an electrical interface 114. Electrical interface 114 may, for example, be an LGA socket or a BGA socket, with or without a downstop incorporated, into which the electronic module can plug.

Voltage regulator 130 is responsible for supplying electrical power for electronic module 120. In the illustrated example, voltage regulator 130 converts power from printed circuit board 110 to power for electronic module 120. For instance, the voltage regulator could convert a 5V power on the printed circuit board to a 1V power for the electronic module. Voltage regulator 130 may be electrically coupled to printed circuit board 110 by any appropriate technique. For example, the voltage regulator may be coupled to an LGA or a pin grid array (PGA) on the printed circuit board. In the illustrated implementation, the voltage regulator is coupled to an electrical interface 116. Electrical interface 116 may, for example, be an LGA or a PGA socket into which the voltage regulator can plug.

Conductive foil 140 is responsible for conveying at least some of the electrical power for electronic module 120 from voltage regulator 130. Conductive foil 140 may, for example, carry a relatively high DC current for electronic module 120. Conductive foil 140 has a first side 142a and a second side 142b, which typically have dimensions that are substantially larger than the thickness of the conductive foil. Conductive foil 140 may, for example, have a thickness between 60-500 microns, which can vary based on application. Conductive foil 140 may be composed of copper, gold, and/or any other appropriate conductive material.

Conductive foil 140 may be electrically coupled to voltage regulator 130 by any appropriate technique. In this illustrated example, conductive foil 140 is directly coupled to voltage regulator 130 by an attachment mechanism (e.g., a screw). In other implementations, the coupling may, for instance, be made by a clamp.

Conductive foil 140 is also electrically coupled to printed circuit board 110. As will be explained in more detail below, conductive foil 140 may, for instance, be electrically coupled to one or more vias in the printed circuit board that convey electricity to one or more contact locations (e.g., grid pads) on first side 112a of the printed circuit board.

System 100 also includes an insulator 150, a conformal fill material 160, a structural support member 170, and a heat sink 180. Insulator 150 electrically insulates conductive foil 140 from other components of system 100, including those used to physically couple the conductive foil to printed circuit board 110. In certain implementations, insulator 150 should be thin and flexible enough to allow the pressure of conformal fill material 160 to mold the insulator and the conductive foil to the contours of printed circuit board 110 with sufficient force to make effective electrical couplings. Insulator 150 may, for example, be made of rubber, vinyl, or any other appropriate electrically insulating material.

Conformal fill material 160 deforms to spread pressure when compressed by structural support member 170. Conformal fill material 160 may, for example, be made of any appropriate conformable material. For instance, the conformal fill material may be made of expanded Polypropylene (EPP) foam, which is readily deformable. EPP foam can also withstand extremely high temperatures (130 degrees C.) and is highly durable.

In certain implementations, conformal fill material 160 may be adhered to insulator 150 or structural support member 170. Additionally, conductive foil 140 could actually be one manufactured piece that includes the conformal material, the insulator, and the conductive foil laminated together in such away that flexibility is maintained.

Structural support member 170 provides a relatively rigid structure for mounting conductive foil 140, insulator 150, and conformal fill material 160 to printed circuit board 110. Structural support member 170 is physically coupled to printed circuit board 110 by mounting posts 190, which also couple to heat sink 180. Heat sink 180, which is mounted to the top of electronic module 120 in this example, provides a way for electronic module 120 to dissipate heat.

In the illustrated example, structural support member 170 compresses conductive foil 140, insulator 150, and conformal fill material 160 between printed circuit board 110 and the structural support member as the structural support member is mounted to posts 190, which also couple heat sink 180 to printed circuit board 110. As the compression occurs, conformal fill material 160 deforms according to irregularities on the surface of second side 112b of printed circuit board 110. The irregularities may, for example, be irregularities in the physical structure of side 112b of the printed circuit board and/or irregularities due to components (e.g., traces) installed on side 112b. The deformation of conformal fill material 160 deforms insulator 150 and conductive foil 140 so that conductive foil 140 may also conform to the irregularities of the printed circuit board surface to make electrical couplings at the appropriate locations of printed circuit board 110.

System 100 additionally includes an insulator 152. Insulator 152 may be used to insulate other via ends in printed circuit board 110, which may not be associated with electronic module 120, from conductive foil 140.

In one mode of operation, voltage regulator 130 receives electrical power from printed circuit board 110. Printed circuit board 110 may, for instance, contain one or more planes for conveying power to various electronic modules mounted on the printed circuit board, and the voltage regulator may be coupled to one of these power planes. Voltage regulator 130 then converts the electrical power from the printed circuit board to an appropriate electrical power for electronic module 120. Voltage regulator 130 sends the electrical power through conductive foil 140 to the vias in the printed circuit board that are coupled to contact locations (e.g., grid pads) that receive electrical power for the electronic module, which thus supplies operational power to the electronic module. A return path to the voltage regulator 130 may, for instance, be supplied by a ground plane in the printed circuit board.

Since conductive foil 140 may convey the majority of the current from voltage regulator 130 to electronic module 120, a large inductive loop may be formed. In another mode of operation, voltage regulator 130 may also send a portion of the electrical power through a power plane of printed circuit board 110, which may be at ground or weaker. Thus, electronic module 120 may receive operational power from the voltage regulator through two paths. The path through conductive foil 140 may have a relatively high inductance and, hence, respond relatively slowly to transients, and the path through the power plane may have a relatively low inductance and, hence, respond relatively quickly to transients. In certain implementations, the conductive foil can convey a DC current and the power plane can convey an AC current.

As the electronic module's power changes, power noise can be generated. Printed circuit board 110 may therefore include a frequency decoupler 118 (e.g., a capacitor) for decoupling the power paths in this mode. The decoupling may, for example, occur at the middle frequencies.

System 100 has a variety of features. For example, system 100 may deliver power to an electronic module without having to add additional power planes or ground planes to the printed circuit board, which can assist in reducing its thickness and manufacturing complexity, especially if the electronic module is localized. The delivered power may, for instance, be incompatible with that handled by the printed circuit board's existing power planes. Moreover, the delivered power may be higher than what a power plane of the printed circuit board can handle, especially when conductive foil 140 can be made relatively thick. As another example, various components of system 100 (e.g., the conductive foil, the insulator, and the conformal fill material) may be added after the printed circuit board is manufactured. Thus, system 100 may be useful when adding an unplanned electronic module to the printed circuit board.

In other implementations, a system for supplying power to an electronic module may include fewer, additional, and/or a different arrangement of components. For example, the vias that electrically couple to the conductive foil may not convey electrical power directly through the printed circuit board. For instance, the vias may send some or all of the electrical power through printed circuit board planes to other vias that convey the electrical power to the electronic module or other electronic components. Thus, the electronic module does not have to be directly opposite the conductive foil. As another example, various components of the coupling system, including the structural support member, the insulator, and the conformal fill material may be manufactured with surface contours that complement any systematic irregularities in any of the other elements, which may be the case where the wiring in the printed circuit board has different densities within the electronic module shadow and results in non-planar surfaces on the board. As another example, various components (e.g., the second insulator, the frequency decoupler, and/or the conformal fill) may not be used. Moreover the structural mounting member may be any structure capable of fitting the conductive foil against the printed circuit board. As an additional example, various layers may be added to the conductive foil assembly as needed.

Figure 2:
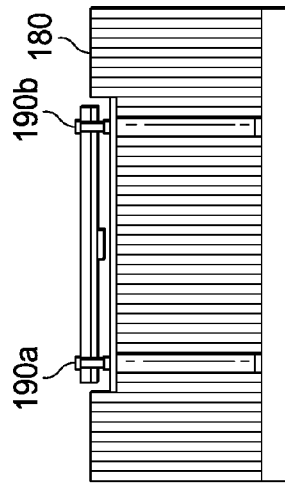
FIG. 2 is another drawing illustrating an example system for supplying power to an electronic module.

FIG. 2 illustrates another example system 200 for supplying power to an electronic module. Similar to system 100, system 200 includes a printed circuit board 210, an electronic module 220, a voltage regulator 230, and a conductive foil 240. As can be seen in this example, however, printed circuit board 210 also has a power plane 212, a signal plane 213, and a ground plane 214, which may generally be used for carrying electricity between various components mounted to the printed circuit board. In this example, for instance, signal plane 213 is used for conveying signals between components other than voltage regulator 230 and electronic module 220.

Printed circuit board 210 also includes a number of vias 216, which are generally used for electrically coupling components on different levels of the printed circuit board. Typically, a region of a circuit board has a large number of vias, but only two have been shown here for each region to clarify the description. For example, via 216d couples voltage regulator 230 to power plane 212, which is coupled to electronic module 220. Thus, voltage regulator 230 can deliver power to electronic module 220 through power plane 212. Additionally, via 216a couples electronic module 220 to ground plane 214, which is coupled to voltage regulator 230. Thus, a return is provided between electronic module 220 and voltage regulator 230. Conductive foil 240 is coupled to contact location 218 of via 216b to also supply electrical power to electronic module 220. The return path for conductive foil may be provided by ground plane 214.

Although FIG. 2 illustrates one example of a system for supplying power to an electronic module, other power supply systems may include fewer, additional, and/or a different arrangement of elements. For example, a printed circuit board may contain a variety of electronic components coupled thereto. Moreover, the printed circuit board may include multiple power planes, signal planes, and ground planes, which may be used for electrically coupling various components on the printed circuit board. Additionally, conductive foil 240 may have a system for coupling it to printed circuit board 210.

Figure 3:
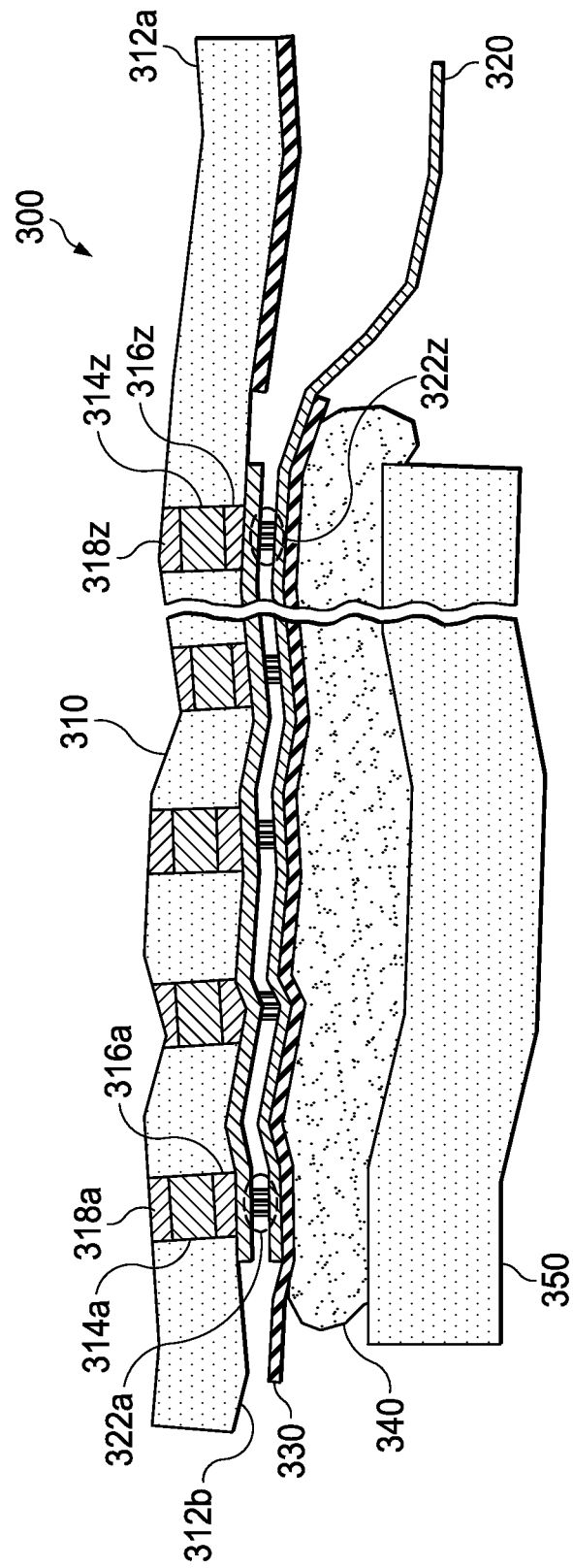
FIG. 3 is a drawing illustrating an example system for coupling a conductive foil to a printed circuit board.

FIG. 3 illustrates an example system 300 for coupling a conductive foil 320 to a printed circuit board 310. In this example, printed circuit board 310 includes a number of vias 314 from first side 312a of printed circuit board to second side 312b. Vias 314 convey electrical power from contact locations 316 (e.g., pads) on second side 312b to contact locations 316 (e.g., pads) on first side 312a of printed circuit board 310. Note that the printed circuit board may also have additional vias that convey electrical signals to other contact location between first side 312a and second side 312b.

Conductive foil 320 includes dendrite groups 322 associated with each contact location 316. Dendrites are basically small protuberances from the conductive foil that aid in making contact with the contact locations. For example, a dendrite may assist with piercing debris and oxides and/or provide wipe, which is a relative mechanical movement between mating contacts during assembly that aids in digging through oxide layers and pushing debris out of the way, as the system is mated. In certain implementations, the conductive foil may also be plated with gold or other metallurgy at the contact locations with dendrites in order to improve the interconnection.

System 300 also includes an insulator 330, a conformal fill material 340, and a structural support member 350, which can used to ensure proper contact between conductive foil 320 and contact locations 316. As can be seen, second side 312b of printed circuit board 310 has irregularities in its surface, which have been exaggerated in this example to illustrate the actual operation. But as structural support member 350 compresses conformal fill material 340, the material deforms according to the shape of second side 312b, especially if insulator 330 and conductive foil 320 are readily deformable. And this deformation causes conductive foil 320 to deform to a shape that corresponds to second side 312b, which assists in making contact between dendrite groups 322 and contact locations 316.

Figure 4:
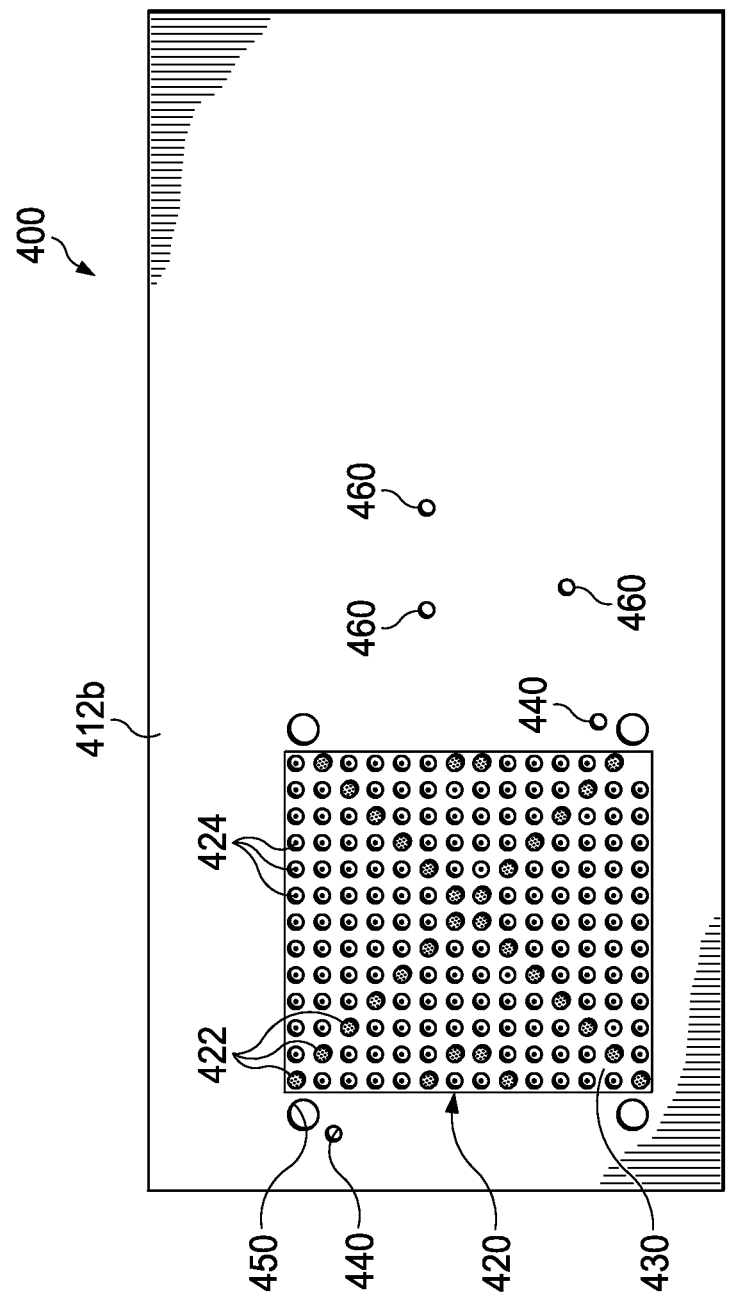
FIG. 4 is a drawing illustrating an example printed circuit board for conveying electrical power from a conductive foil to an electronic module.

FIG. 4 illustrates an example printed circuit board 400 for conveying electrical power from a conductive foil to an electronic module. In particular, FIG. 4 illustrates a second side 412b of printed circuit board 400, where a first side of the printed circuit board has one or more electronic modules coupled thereto.

Printed circuit board 400 includes a set of contact locations 420 on second side 412b, which are coupled to vias. Set 420 includes contact locations 422, which are electrically coupled to vias that are electrically coupled to power receiving contact locations located on the first side of the printed circuit board. Thus, electrical power may flow through contact locations 422 from a conductive foil. Set 420 also includes contact locations 424, which may be electrically coupled to contact locations at various locations on the printed circuit board. Contact locations 422, 424 may, for example, pad areas. If contact locations 422, 424 are pads areas, contact locations 422 may encompass the vias associated with the power domain, and contact locations 424 may be small pads. Between contact locations 422 is a conductive fill material 430, which can serve to distribute electrical power between contact locations 422. As can be seen, however, a clearance is provided between fill material 430 and contact locations 424. Contact locations 422 may be plated with gold or other metallurgy to improve the interconnection with the conductive foil.

Printed circuit board 400 also includes alignment holes 440 and mounting holes 450. Alignment holes 440 can assist in positioning a conductive foil, along with its coupling element(s). In certain implementations, for example, the position of a conductive foil may need to be tightly controlled so that is only makes contact with the appropriate contact locations in set 420. Alignment holes 440 may, for instance, have posts inserted therein to facilitate alignment of the conductive foil, an insulator, and/or a conformal fill material. Such posts may be in contact with the conductive foil and may be non-conductive (e.g., formed from plastic or floating metal) or ohmically attached to the power domain, with a relatively high resistance, for instance.

Mounting holes 450 may be used for structurally mounting one or more components (e.g., a heat sink or an electronic module) to the printed circuit board. For example, mounting posts for a heat sink located on the first side of printed circuit board 410 could extend through mounting holes 450 and be secured on the second side of the printed circuit board. Additionally, a conductive foil may be secured to the printed circuit board by the mounting holes.

Printed circuit board 400 also includes via ends 460 for other electronic modules coupled to the first side of the circuit board. In particular implementations, these via ends may be covered by an insulator to prevent a conductive foil supplying power through contact locations 422 from coming into contact with these ends.

Other implementations may include fewer, additional, and/or a different arrangement of elements. For example, certain implementations may not include alignment apertures. As another example, the contact locations not associated with the electronic module power domain may have a modified padstack in the allegro design that has an enhanced solder mask over the contact locations. This could be used instead of clearances or in conjunction with clearances to help assure that no shorting occurs. As a further example, some or all of the vias not associated with the power domain for the electronic module may not extend completely through the printed circuit board. These vias could, for instance, be coupled to internal planes with signals going to other vias and eventually to other electronic components. As an additional example, the conductive foil may make contact with the conductive fill material at locations other than the contact locations to provide more electrical contact area between the two.

Figure 5:
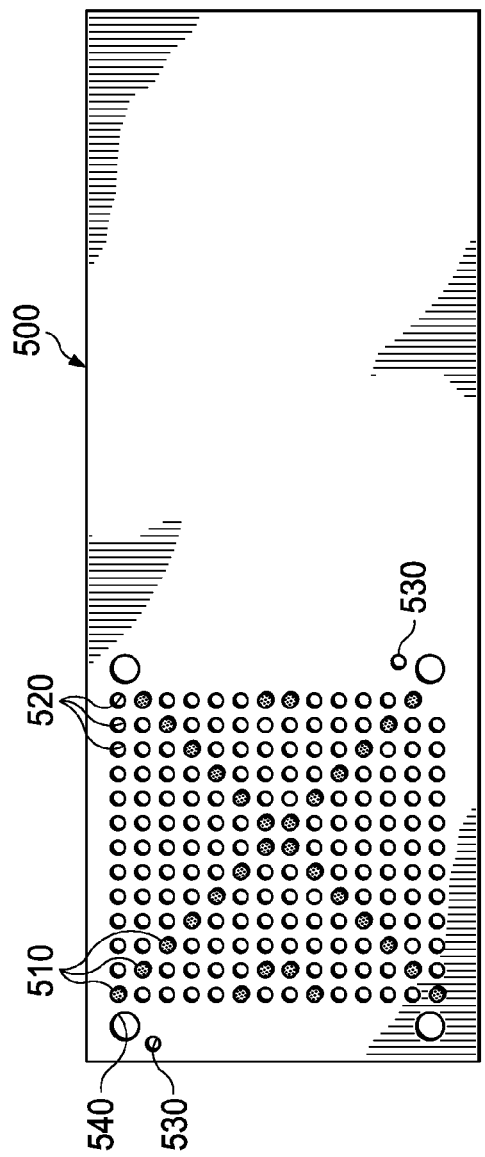
FIG. 5 is a drawing illustrating an example conductive foil that may be used to convey electrical power for an electronic module.

FIG. 5 illustrates an example conductive foil 500 that may be used to convey electrical power for an electronic module. Conductive foil 500 includes a number of locations 510 at which electrical coupling may be made with vias of a printed circuit board that convey electrical power to an electronic module on the opposite side of the printed circuit board. Electrical coupling may, for example, be made to pads of the vias. Locations 510 may specially coated (e.g., with gold) and include structure (e.g., dendrites) to assist with making an electrical coupling with the vias. Conductive foil 500 also includes a number of apertures 520 that provide clearance around the printed circuit board vias, and any associated contact locations, that have signals, ground, and/or power other than for the power domain for the electronic module receiving power through the vias of the printed circuit board.

Conductive foil 500 additionally includes alignment apertures 530 and mounting apertures 540. Alignment apertures 530 assist with ensuring proper positioning of conductive foil 500 with respect to the printed circuit board to which it will be mounted, which can prevent shorts between the foil and ground, signal, and other power domains. Mounting apertures 540 are large enough to allow clearance around any mounting posts (e.g., for a structural support member) to ensure that no ohmic connection is made.

Figure 6:
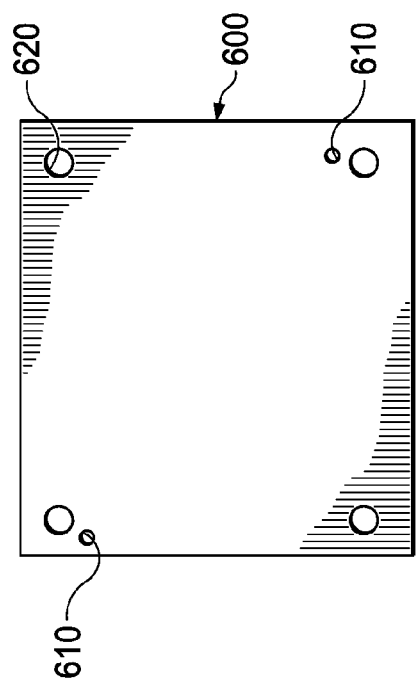
FIG. 6 is a drawing illustrating of an example insulator.

FIG. 6 illustrates an example insulator 600. Insulator 600 includes alignment apertures 610 and mounting apertures 620. Alignment apertures 610 assist with ensuring proper positioning of insulator 600 with respect to the printed circuit board to which it will be mounted. Mounting apertures 620 are large enough to allow clearance around mounting posts (e.g., for a structural support member). Note that a conformal fill material may be patterned similar to the insulator.

Figure 7:
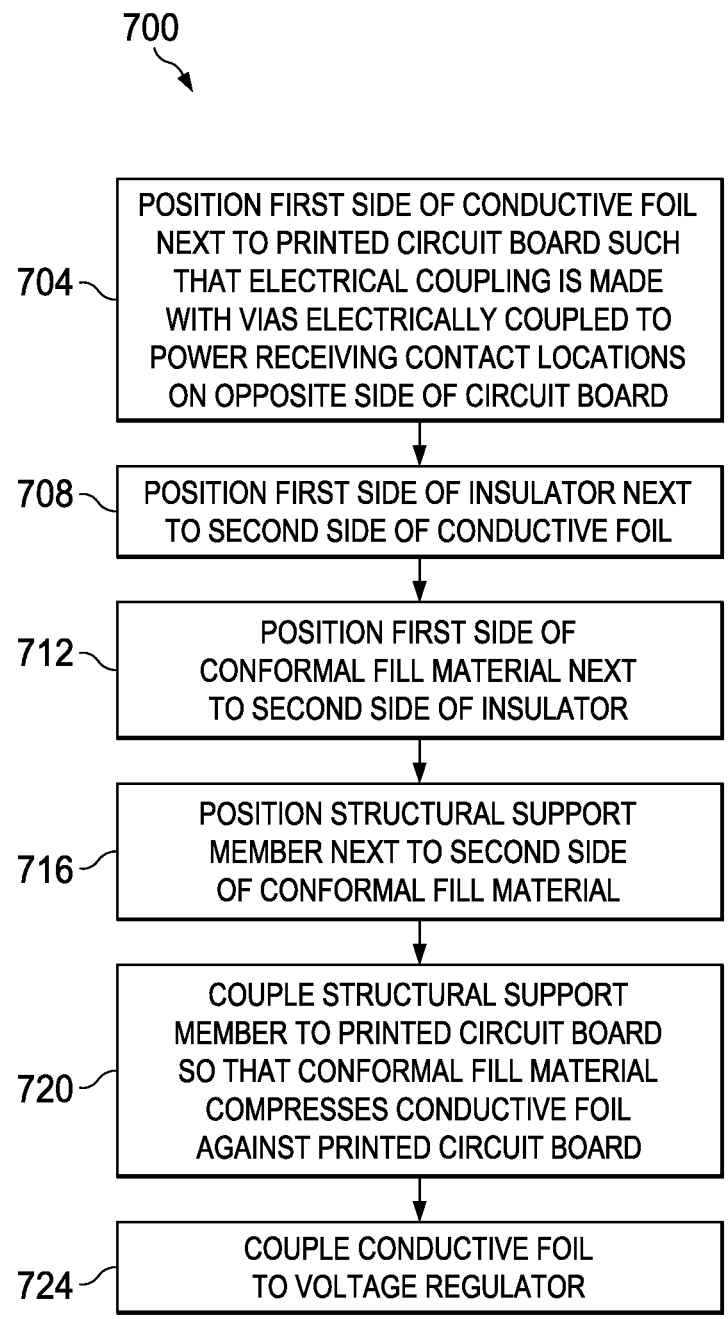
FIG. 7 is a flowchart illustrating an example process 700 for forming a power supply for an electronic module.

FIG. 7 illustrates an example process 700 for forming a power supply for an electronic module. Process 700 may, for example, be used to make system 100.

Process 700 calls for positioning a first side of a conductive foil next to a printed circuit board such that an electrical coupling is made with vias that are electrically coupled to power receiving contact locations on an opposite side of circuit board (operation 704). The positioning may, for example, be facilitated by aligning apertures in the conductive foil with alignment posts in the printed circuit board. Additionally, the conductive foil may have mounting apertures therein, and these may be aligned with mounting posts that extend from or through the printed circuit board to aid in the positioning of the conductive foil.

Process 700 also calls for positioning a first side of an insulator next to a second side of the conductive foil (operation 708). The positioning may, for example, be facilitated by aligning apertures in the insulator with alignment posts in the printed circuit board. Additionally, the insulator may have mounting apertures therein, and these may be aligned with mounting posts that extend from or through the printed circuit board to aid in the positioning of the insulator.

Process 700 additionally calls for positioning a first side of a conformal fill material next to a second side of the insulator (operation 712). The positioning may, for example, be facilitated by aligning apertures in the conformal fill material with alignment posts in the printed circuit board. Additionally, the conformal fill material may have mounting apertures therein, and these may be aligned with mounting posts that extend from or through the printed circuit board to aid in the positioning of the fill material.

Process 700 further calls for positioning a structural support member next to a second side of the conformal fill material (operation 716). The positioning may, for example, be facilitated by aligning mounting apertures in the structural support member with mounting posts that extend from or through the printed circuit board.

Process 700 also calls for coupling the structural support member to the printed circuit board such that the conformal fill material compresses the conductive foil against the printed circuit board (operation 720). The coupling may, for example, be accomplished by coupling the structural support member to mounting posts that extend from or through the printed circuit board.

Process 700 further calls for coupling the conductive foil to a voltage regulator (operation 724). The voltage regulator may, for example, convert power from the printed circuit board to power for the electronic module.

Although process 700 illustrates one example process for forming a power supply for an electronic module, other processes for forming a power supply may include fewer, additional, and or a different arrangement of operations. For example, a process may not include positioning the insulator next to the conductive foil and/or the conformal fill material next to the insulator, as two of more of these may be manufactured together as one piece. Moreover, the insulator and/or the conformal fill material may be positioned relative to the conductive foil before the conductive foil is positioned next to the printed circuit board. Additionally, the coupling to the voltage regulator may be performed at various points in a process.

The terminology used herein is for the purpose of describing particular implementations only and is not intended to be limiting. As used herein, the singular form "a", "an", and "the" are intended to include the plural forms as well, unless the context clearly indicates otherwise. It will be further understood that the terms "comprises" and/or "comprising," when used in the this specification, specify the presence of stated features, integers, steps, operations, elements, and/or components, but do not preclude the presence or addition of one or more other features, integers, steps, operations, elements, components, and/or groups therefore.

The corresponding structure, materials, acts, and equivalents of all means or steps plus function elements in the claims below are intended to include any structure, material, or act for performing the function in combination with other claimed elements as specifically claimed. The description of the present implementations has been presented for purposes of illustration and description, but is not intended to be exhaustive or limited to the implementations in the form disclosed. Many modifications and variations will be apparent to those of ordinary skill in the art without departing from the scope and spirit of the disclosure. The implementations were chosen and described in order to explain the principles of the disclosure and the practical application and to enable others or ordinary skill in the art to understand the disclosure for various implementations with various modifications as are suited to the particular use contemplated.

A number of implementations have been described for supplying power to an electronic module, and several others have been mentioned or suggested. Moreover, those skilled in the art will readily recognize that a variety of additions, deletions, modifications, and substitutions may be made to these implementations while still supplying power to an electronic module. Thus, the scope of the protected subject matter should be judged based on the following claims, which may capture one or more concepts of one or more implementations.

The invention claimed is:

1. A system comprising:
a printed circuit board comprising a plurality of contact locations on a first side, at least one of the contact locations electrically coupled to a via to a second side of the printed circuit board;
an electronic module located on the first side of the printed circuit board and electrically coupled to the contact locations, the electronic module receiving electrical power through the at least one contact location electrically coupled to a via to the second side of the printed circuit board;
a conductive foil located on the second side of the circuit board and electrically coupled to at least the via that is electrically coupled to a contact location that receives electrical power for the electronic module, the conductive foil adapted to convey electrical power for the electronic module;
a deformable insulator located on the side of the conductive foil opposite the printed circuit board;
a conformal fill material located on the side of the insulator opposite the conductive foil; and
a structural support member located on the side of the fill material opposite the insulator, the structural support member adapted to compress the conductive foil, the insulator, and the fill material between the structural support member and the printed circuit board.

2. The system of claim 1, wherein the conductive foil comprises apertures that correspond to printed circuit board vias that do not convey electrical power to the electronic module.

3. The system of claim 1, wherein the printed circuit board is adapted to serve as a return path for the electrical power supplied through the conductive foil.

4. The system of claim 1, wherein the fill material deforms according to irregularities in the second side of the printed circuit board when compressed by the support member.

5. The system of claim 1, wherein the conductive foil comprises dendrites at the location where the conductive foil electrically couples to the via.

6. The system of claim 1, further comprising a voltage regulator coupled to the conductive foil, the voltage regulator adapted to convert electrical power from the printed circuit board to electrical power for the electronic module and convey the electrical power through the conductive foil.

7. The system of claim 6, wherein the voltage regulator is adapted to convey a portion of the electrical power to the electronic module through the printed circuit board.

8. The system of claim 6, wherein:
the voltage regulator is adapted to convey the electrical power through the printed circuit board by using a power plane of the printed circuit board; and
the power path through the conductive foil has a first inductance and the power path through the printed circuit board has a second inductance that is much lower than the first inductance.

9. The system of claim 8, wherein the printed circuit board includes a frequency decoupler to decouple frequencies between the electrical power through the conductive foil and the electrical power through the power plane.

10. A system comprising:
a conductive foil having a first side and a second side and including:
electrical coupling locations on the first side that correspond to a first set of printed circuit board vias; and
apertures from the first side to the second side that correspond to a second set of printed circuit boards vias;
wherein the conductive foil is adapted to convey electrical power for an electronic module;
a deformable insulator located on the second side of the conductive foil; and
a conformal fill material located on the side of the insulator opposite the conductive foil, the fill material adapted to deform according to irregularities in a printed circuit board surface when compressed.

11. The system of claim 10, wherein the conductive foil comprises dendrites at the electrical coupling locations.

12. The system of claim 10, further comprising a voltage regulator coupled to the conductive foil, the voltage regulator adapted to convert electrical power from a printed circuit board to electrical power for an electronic module and convey the electrical power through the conductive foil.

13. The system of claim 12, wherein the voltage regulator is further adapted to convey electrical power for an electronic module through the conductive foil and a printed circuit board.

14. A system comprising:
a printed circuit board comprising:
a grid array on a first side,
electrical vias from a plurality of grid array pads to a second side of the printed circuit board,
a power plane adapted to convey electrical power through the printed circuit board, and
a ground plane adapted to serve as a return path for conveyed power;
an electronic module located on the first side of the printed circuit board and electrically coupled to the grid array, the electronic module receiving electrical power through at least some of the grid pads coupled to the vias;

a conductive foil located on the second side of the circuit board and adapted to convey electrical power for the electronic module, the conductive foil comprising dendrites at locations where the conductive foil electrically couples to the vias coupled to grid pads that receive electrical power for the electronic module and apertures that correspond to printed circuit board vias that do not convey electrical power for the electronic module;

a voltage regulator coupled to the conductive foil, the voltage regulator adapted to convert electrical power from the printed circuit board to electrical power for the electronic module and convey a portion of the electrical power through the conductive foil and a portion of the electrical power through the power plane of the printed circuit board;

a thin deformable insulator located on the second side of the foil;

a thin conformal fill material located on the side of the insulator opposite the conductive foil; and a structural support member located on the side of the fill material opposite the insulator, the support member adapted to compress the conductive foil, the insulator, and the fill material between the support member and the printed circuit board such that the fill material deforms the conductive foil according to irregularities in the second side of the printed circuit board.

* * * * *